(12) United States Patent
Lin et al.

(10) Patent No.: US 11,489,499 B1
(45) Date of Patent: Nov. 1, 2022

(54) CIRCUIT AND METHOD FOR SWITCHING BETWEEN TERNARY MODULATION AND QUATERNARY MODULATION

(71) Applicant: Elite Semiconductor Microelectronics Technology Inc., Hsinchu (TW)

(72) Inventors: Tsung-Fu Lin, Hsinchu (TW); Hsin-Yuan Chiu, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 17/396,853

(22) Filed: Aug. 9, 2021

(51) Int. Cl.
*H03F 3/217* (2006.01)
*H03F 3/38* (2006.01)
*H03F 1/02* (2006.01)

(52) U.S. Cl.
CPC ..... *H03F 3/2173* (2013.01); *H03F 2200/351* (2013.01)

(58) Field of Classification Search
CPC .......................... H03F 3/2173; H03F 2200/351
USPC ....................................... 330/10, 207 A, 251
See application file for complete search history.

(56) References Cited

U.S. PATENT DOCUMENTS

| 9,654,068 | B2 * | 5/2017 | Wu | H03F 3/183 |
| 10,404,227 | B1 * | 9/2019 | Tsao | H03F 3/45475 |
| 11,211,903 | B1 * | 12/2021 | Hsu | H03F 1/52 |

\* cited by examiner

*Primary Examiner* — Hieu P Nguyen
(74) *Attorney, Agent, or Firm* — Cooper Legal Group LLC (57) ABSTRACT

A switch circuit provides a first output signal and a second output signal for switching between ternary modulation and quaternary modulation for a target device. A first output signal is provided from one of a first signal, a second signal and a ground signal according to an input signal and a duty signal, wherein the first signal is generated through performing a one-bit left-shift operation for the input signal, and the second signal is generated through adding the input signal and the duty signal. A second output signal is provided from one of a third signal, a fourth signal and the ground signal according to the input signal and the duty signal, wherein the third signal is generated through subtracting the input signal from the duty signal, and the fourth signal is generated through performing a two's-complement transformation and the one-bit left-shift operation for the input signal.

14 Claims, 7 Drawing Sheets

CIRCUIT AND METHOD FOR SWITCHING BETWEEN TERNARY MODULATION AND QUATERNARY MODULATION

BACKGROUND

Technical Field

The present disclosure relates to a circuit and method for modulation switching of a target device. More specifically, the present disclosure relates to a circuit and method for switching between a ternary modulation and a quaternary modulation for a target device.

Descriptions of the Related Art

A "class-D" amplifier is a type of audio amplifier commonly used in the art. A class-D amplifier can provide two pulse-width modulation (PWM) signals for a load (e.g., a speaker), so as to drive the load with the two PWM signals. The two PWM signals may form a ternary modulation or a quaternary modulation that corresponds to a target duty cycle (i.e., the desired duty cycle for performing modulations). When providing PWM signals corresponding to "large" target duty cycles (e.g., a target duty cycle of 50%), ternary modulations are able to provide higher efficiency and lower power consumption than quaternary modulations. On the other hand, quaternary modulations are able to provide better total harmonic distortion (THD) and lower noises than ternary modulations when providing PWM signals corresponding to "small" target duty cycles (e.g., a duty cycle of 20%). Therefore, the ideal way for using a class-D amplifier is to adopt the abovementioned two kinds of modulation alternately according to the target duty cycle, so as to achieve a better total performance of the amplifier.

Figure 1A:
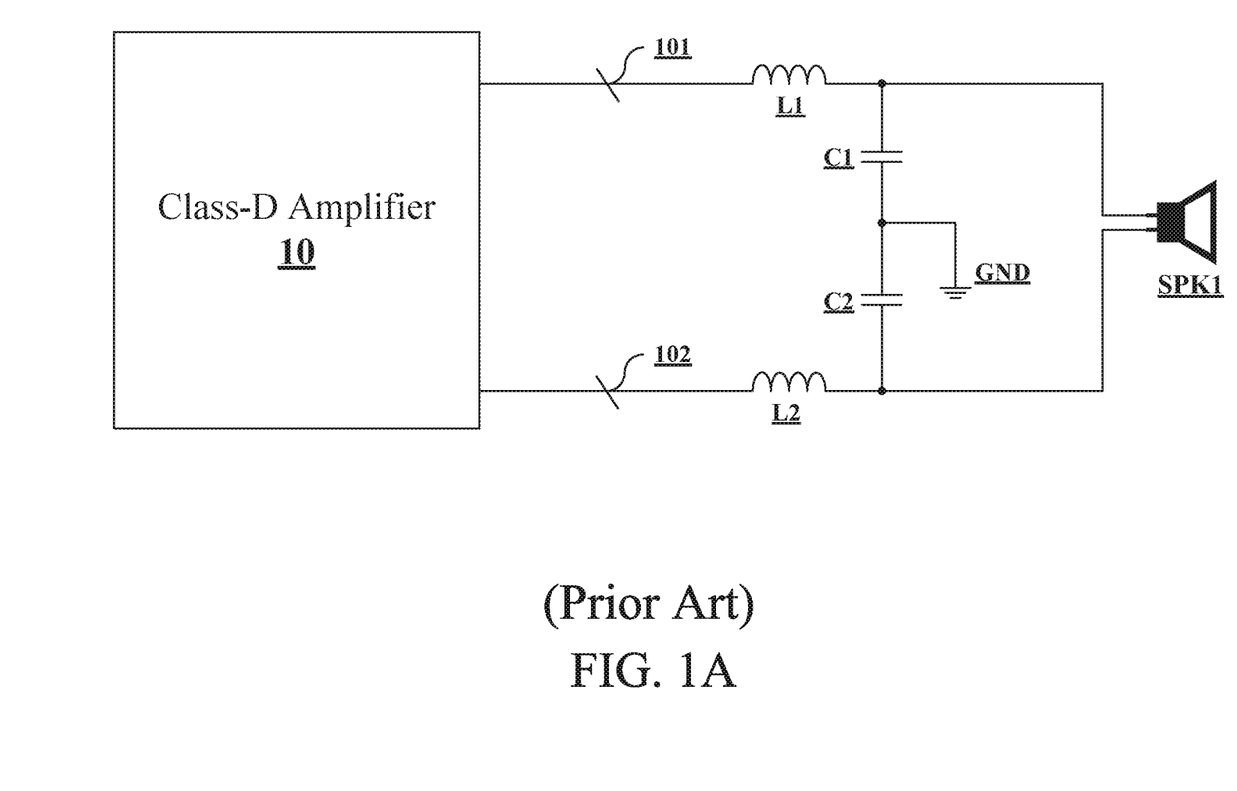
FIG. 1A depicts a schematic view of a conventional class-D amplifier driving a load.
Figure 1B:
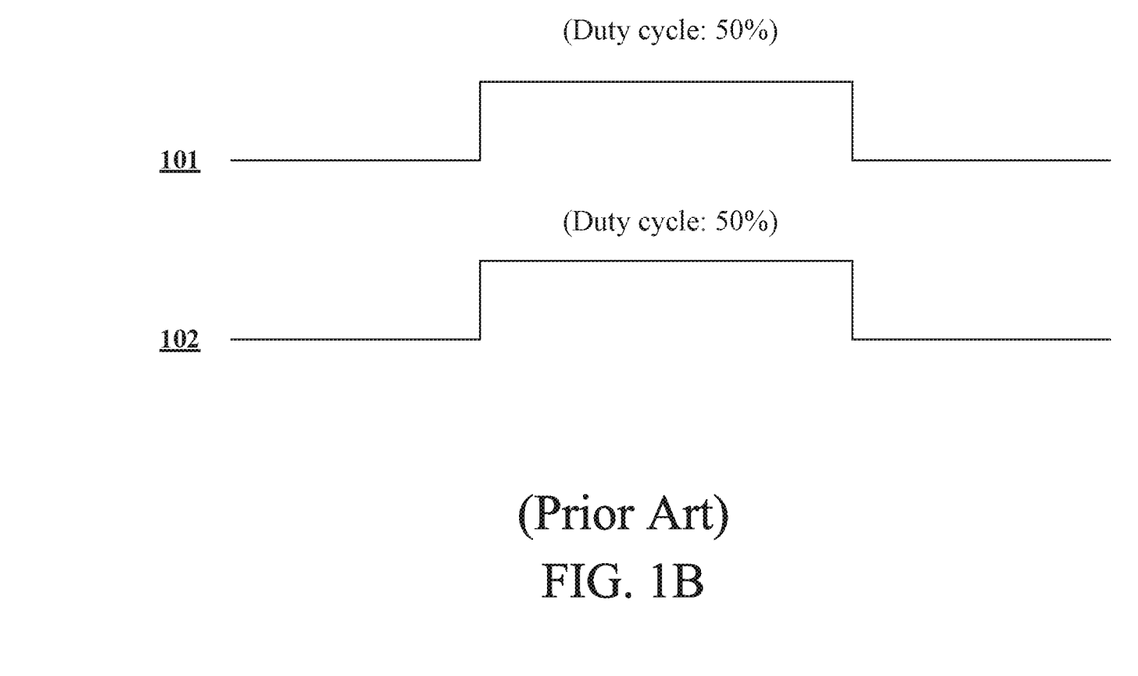
FIG. 1B depicts two PWM signals provided by a conventional class-D amplifier with starting duty cycles of 50%.

FIG. 1A depicts a schematic view of a conventional class-D amplifier driving a load. FIG. 1B depicts two PWM signals provided by a conventional class-D amplifier with starting duty cycles of 50%. Referring to both FIG. 1A and FIG. 1B, a class-D amplifier 10 may drive a load SPK1 with a PWM signal 101 and a PWM signal 102. An LC circuit comprising an inductor L1 and a capacitor C1 and another LC circuit comprising an inductor L2 and a capacitor C2 are deployed between the class-D amplifier 10 and the load SPK1. In conventional ways of modulation, the starting duty cycle of the duty signal is set to 50%, that is, each of the two PWM signals 101 and 102 of the class-D amplifier 10 having a duty cycle of 50% at the beginning of the modulation. Since the two PWM signals 101 and 102 are having the same duty cycle, there will be no current flowing through the two output terminals of the class-D amplifier 10, and the load SPK1 (e.g., speaker) will not be driven. However, the capacitors C1 and C2 will still be charged by the two PWM signals 101 and 102 for half of a period, during which the two PWM signals 101 and 102 are still in high level. Such situation shall lead to unnecessary power consumption.

In view of this, there is an urgent need in the art for a new way of providing a ternary modulation or a quaternary modulation with less power consumption.

SUMMARY

To solve at least the abovementioned problem, the present disclosure provides a switching circuit for switching between a ternary modulation and a quaternary modulation for a target device. The switching circuit may comprise a first computing circuit and a second computing circuit. The first computing circuit may be configured to provide a first output signal, and the first computing circuit may comprise a shifter, an adder, a first multiplexer, a second multiplexer, and a third multiplexer. The first multiplexer may be electrically connected with the shifter and the adder, the second multiplexer may be electrically connected with the adder and a ground-signal source, and the third multiplexer may be electrically connected with the first multiplexer and the second multiplexer. The shifter is configured to perform a left-shift operation of one bit for an input signal so as to generate a first signal. The adder is configured to add the input signal and a duty signal so as to generate a second signal. The second computing circuit may be configured to provide a second output signal, and the second computing circuit may comprise a subtractor, a two's-complement shifter, a fourth multiplexer, a fifth multiplexer and a sixth multiplexer. The fourth multiplexer may be electrically connected with the ground-signal source and the subtractor, the fifth multiplexer may be electrically connected with subtractor and the two's-complement shifter, and the sixth multiplexer may be electrically connected with the fourth multiplexer and the fifth multiplexer. The subtractor is configured to subtract the input signal from the duty signal so as to generate a third signal. The two's-complement shifter is configured to perform a two's-complement transformation and the left-shift operation of one bit for the input signal so as to generate a fourth signal. The first output signal output by the third multiplexer may be the first signal and the second output signal output by the sixth multiplexer may be a ground signal when a polarity of the input signal is positive and a number represented by the input signal is greater than a number represented by the duty signal. The first output signal may be the second signal and the second output signal may be the third signal when the polarity of the input signal is positive and the number represented by the input signal is not greater than the number represented by the duty signal, or when the polarity of the input signal is negative and a number represented by an inverse signal of the input signal is not greater than the number represented by the duty signal. The first output signal may be the ground signal and the second output signal may be the fourth signal when the polarity of the input signal is negative and the number represented by the inverse signal is higher than the number represented by the duty signal.

To solve at least the abovementioned problem, the present disclosure further provides a method for switching between a ternary modulation and a quaternary modulation for a target device. The method may be executed by an electronic computing device. The method may comprise steps as follows: providing a first output signal from one of a first signal, a second signal and a ground signal according to an input signal and a duty signal, wherein the first signal is generated through performing a left-shift operation of one bit for the input signal, and the second signal is generated through adding the input signal and the duty signal; and providing a second output signal from one of a third signal, a fourth signal and the ground signal according to the input signal and the duty signal, wherein the third signal is generated through subtracting the input signal from the duty signal, and the fourth signal is generated through performing a two's-complement transformation and the left-shift operation of one bit for the input signal. The first output signal may be the first signal and the second output signal may be a ground signal when a polarity of the input signal is positive and a number represented by the input signal is greater than a number represented by the duty signal. The first output signal may be the second signal and the second output signal may be the third signal when the polarity of the input signal is positive and the number represented by the input signal is not higher than the number represented by the duty signal, or when the polarity of the input signal is negative and a number represented by an inverse signal of the input signal is not greater than the number represented by the duty signal. The first output signal may be the ground signal and the second output signal may be the fourth signal when the polarity of the input signal is negative and the number represented by the inverse signal is greater than the number represented by the duty signal.

The modulation circuit and modulation method provided by the present disclosure allow a variable duty cycle of the duty signal, which further allows lowering the starting duty cycle of the modulation from 50% but still provides a correct ternary modulation or quaternary modulation for the target device. Therefore, the aforementioned charging time of the LC circuits may be shortened so as to reduce the power consumption. In view of this, the modulation circuit and modulation method provided by the present disclosure indeed solve the abovementioned problem in the art.

This summary overall describes the core concept of the present invention and covers the problem to be solved, the means to solve the problem and the effect of the present invention to provide a basic understanding of the present invention by those of ordinary skill in the art. However, it shall be appreciated that, this summary is not intended to encompass all embodiments of the present invention but is provided only to present the core concept of the present invention in a simple form and as an introduction to the following detailed description. The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The drawings can assist the description of the present disclosure, wherein.

DETAILED DESCRIPTION

In the following description, the modulation circuit and the modulation method for providing a ternary modulation or a quaternary modulation for a target device provided by the present disclosure will be explained with reference to embodiments thereof. However, these embodiments are not intended to limit the present invention to any environment, applications, or implementations described in these embodiments. Therefore, description of these embodiments is only for purpose of illustration rather than to limit the present invention. It should be appreciated that, in the following embodiments and the attached drawings, elements unrelated to the present invention are omitted from depiction. In addition, dimensions of and dimensional scales among individual elements in the attached drawings are provided only for illustration, but not to limit the scope of the present invention.

Figure 2:
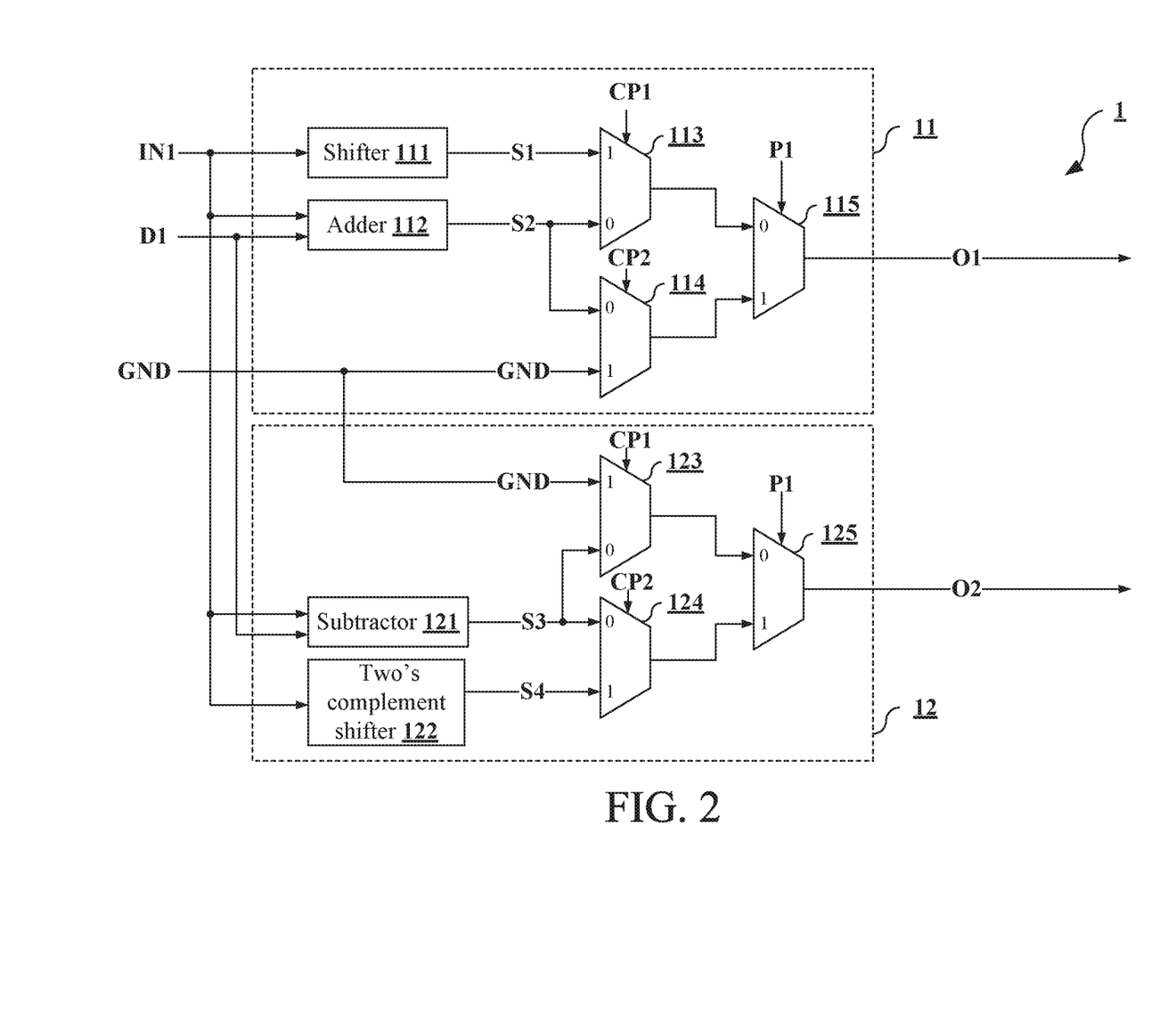
FIG. 2 depicts a schematic view of a switching circuit according to one or more embodiments of the present disclosure.

FIG. 2 depicts a schematic view of a switching circuit according to one or more embodiments of the present disclosure. The contents shown in FIG. 2 are only for illustrating the embodiment of the present disclosure, instead of limiting the present disclosure.

Referring to FIG. 2, a switching circuit 1 may basically comprise a first computing circuit 11 and a second computing circuit 12. An input signal IN1, a duty signal D1, and a ground signal GND may be input to both of the first computing circuit 11 and the second computing circuit 12. The input signal IN1 may represent half of the target duty cycle of the modulation formed by a set of PWM signals utilized to drive a target device in the future (hereinafter referred to as a set of "target PWM signals"). The duty signal D1 may represent the initial duty cycle of the two output signals at the beginning of the modulation. The ground signal GND is the signal provided by the ground-signal source. In some embodiments, the input signal IN1, the duty signal D1 and the ground signal GND may be binary signals which use the number "0" to represent a reference voltage and use the number "1" to represent a supply voltage.

The first computing circuit 11 and the second computing circuit 12 may generate a first output signal O1 and a second output signal O2 respectively by processing the duty signal D1 with the input signal IN1. Numbers represented by the two output signals O1 and O2 may represent the duty cycles of the set of target PWM signals. In some embodiments, the first computing circuit 11 and the second computing circuit 12 may be electrically connected with a PWM-signal-generating circuit, and the two output signals O1 and O2 may be transmitted to the PWM-signal-generating circuit. Since the output signals O1 and O2 are both binary signals that are capable of representing numbers, the PWM-signal-generating circuit may be configured to generate the set of target PWM signals in accordance with the first output signal O1 and the second output signal O2, such that the set of target PWM signals may have the duty cycles corresponding to the output signals O1 and O2. The set of target PWM signals may form a ternary modulation or a quaternary modulation. The specific details of the PWM-signal-generating circuit (i.e., a circuit capable of generating PWM signals with specific duty cycles according to the input signals that represent numbers) may be well-appreciated by those of ordinary skill in the art, and thus are not further described.

After applying the set of target PWM signals to two sides of the target device, a level difference may exist between the two sides when there is a difference of duty cycle between the set of target PWM signals, and thus the target device may be driven by the level difference. As a result, the duty cycles of the set of PWM signals applied to the target device may directly affect the performance of the target device. The target device may be, for example, a speaker, a headphone, or any other audio output device well-known to those of ordinary skill in the art.

The first computing circuit 11 may comprise a shifter 111, an adder 112, a first multiplexer 113, a second multiplexer 114, and a third multiplexer 115. The shifter 111 may be configured to perform a left-shift operation of one bit for the input signal IN1 so as to generate a first signal S1. The adder 112 may be configured to add the input signal IN1 and the duty signal D1 so as to generate a second signal S2.

The first multiplexer 113 may be electrically connected with the shifter 111 and the adder 112 so as to receive the first signal S1 and the second signal S2, and the first multiplexer 113 may select (i.e., allow the passing of) one of the first signal S1 and the second signal S2 as an output according to a comparison signal CP1. The comparison signal CP1 may present "1" when a number represented by the input signal IN1 is greater than a number represented by the duty signal D1, and may present "0" when the number represented by the input signal IN1 is not greater than the number represented by the duty signal D1. When the comparison signal CP1 presents "1", the first multiplexer 113 may allow passing of the first signal S1 to the corresponding terminal. On the contrary, when the comparison signal CP1 presents "0", the first multiplexer 113 may allow passing of the second signal S2 to the corresponding terminal.

Note that since the input signal IN1, the duty signal D1, the ground signal GND may be binary signals representing numbers, sentences in a form of "a number represented by a signal being greater/less than a number represented by another signal" may hereinafter be abbreviated to a form of "a signal being greater/less than another signal" for ease of description.

The second multiplexer 114 may be electrically connected with the adder 112 and a ground-signal source so as to receive the second signal S2 and the ground signal GND, and the second multiplexer 114 may select one of the second signal S2 and the ground signal GND as an output according to a comparison signal CP2. The comparison signal CP2 may present "1" when an inverse of the input signal IN1 is greater than the duty signal D1, and may present "0" when the inverse of the input signal IN1 is not greater than the duty signal D1. When the comparison signal CP2 presents "1", the second multiplexer 114 may allow passing of the ground signal GND to the corresponding terminal. On the contrary, when the comparison signal CP2 presents "0", the second multiplexer 114 may allow passing of the second signal S2 to the corresponding terminal. In some embodiments, the switching circuit 1 may further comprise a digital comparator and an inverter so as to generate the comparison signals CP1 and CP2.

The third multiplexer 115 may be electrically connected with the first multiplexer 113 and the second multiplexer 114, and may select one of the outputs of the first multiplexer 113 and the second multiplexer 114 as the first output signal O1 according to a polarity signal P1. The polarity signal P1 may represent a polarity (i.e., positive/negative) of the input signal IN1. In some embodiments, the polarity signal P1 is the most significant bit (MSB, i.e., the leftmost bit) of the input signal IN1, and the MSB may present "0" for positive polarity and present "1" for negative polarity. When the polarity signal P1 presents "1", the third multiplexer 115 may select the output of the second multiplexer 114 as the first output signal O1. On the contrary, when the polarity signal P1 presents "0", the third multiplexer 115 may select the output of the first multiplexer 113 as the first output signal O1.

The second computing circuit 12 is similar to the first computing circuit 11. Specifically, the second computing circuit 12 may comprise a subtractor 121, a two's-complement shifter 122, a fourth multiplexer 123, a fifth multiplexer 124 and a sixth multiplexer 125. The subtractor 121 may be configured to subtract the input signal IN1 from the duty signal D1 so as to generate a third signal S3. The two's-complement shifter 122 may be configured to perform a two's-complement transformation and the left-shift operation of one bit for the input signal IN1 so as to generate a fourth signal S4.

The fourth multiplexer 123 may be electrically connected with the ground-signal source and the subtractor 121 so as to receive the ground signal GND and the third signal S3. The fourth multiplexer 123 may select one of the ground signal GND and the third signal S3 as an output according to the comparison signal CP1. When the comparison signal CP1 presents "1", the fourth multiplexer 123 may allow passing of the ground signal GND to the corresponding terminal. On the contrary, when the comparison signal CP1 presents "0", the fourth multiplexer 123 may allow passing of the third signal S3 to the corresponding terminal.

The fifth multiplexer 124 may be electrically connected with subtractor 121 and the two's-complement shifter 122 so as to receive the third signal S3 and the fourth signal S4. The fifth multiplexer 124 may select one of the third signal S3 and the fourth signal S4 as an output according to the comparison signal CP2. When the comparison signal CP2 presents "1", the fifth multiplexer 124 may allow passing of the fourth signal S4 to the corresponding terminal. On the contrary, when the comparison signal CP2 presents "0", the fifth multiplexer 124 may allow passing of the third signal S3 to the corresponding terminal.

The sixth multiplexer 125 may be electrically connected with the fourth multiplexer 123 and the fifth multiplexer 124, and the sixth multiplexer 125 may select one of the outputs of the fourth multiplexer 123 and the fifth multiplexer 124 as the second output signal O2 according to the polarity signal P1. To be more specific, when the polarity signal P1 presents "1", the sixth multiplexer 125 may select the output of the fifth multiplexer 124 as the second output signal O2. On the contrary, when the polarity signal P1 presents "0", the sixth multiplexer 125 may select the output of the fourth multiplexer 123 as the second output signal O2.

As described above, the switching circuit 1 may generate the first output signal O1 and the second output signal O2 according to the input signal IN1, the duty signal D1, the ground signal GND and the polarity signal P1. Therefore, the set of target PWM signals may be obtained via generating corresponding PWM signals in accordance with the first output signal O1 and the second output signal O2.

The correspondence of the type of modulation (i.e., ternary or quaternary) and the different results of the first output signal O1 and second output signal O2, and the corresponding input signal IN1, duty signal D1, polarity signal P1 and type of the two output signals O1 and O2 may be summarized into four cases (a)-(d) as shown in the Table 1 below:

TABLE 1

| Case | P1 | CP1 | CP2 | O1 | O2 | Type of Modulation |
|---|---|---|---|---|---|---|
| (a) | 0 | 0 | | S2 | S3 | Quaternary |
| (b) | 0 | 1 | | S1 | GND | Ternary |
| (c) | 1 | | 0 | S2 | S3 | Quaternary |
| (d) | 1 | | 1 | GND | S4 | Ternary |

Referring to Table 1, in Cases (a) and (b), the polarity of input signal is positive, and the polarity signal P1 may present "0". Therefore, the third multiplexer 115 may select the output of the first multiplexer 113 as the first output signal O1, and the sixth multiplexer 125 may select the output of the fourth multiplexer 123 as the second output signal O2, whereas the outputs of the first multiplexer 113 and the fourth multiplexer 123 may be determined according to the comparison signal CP1 instead of the comparison signal CP2. When the comparison signal CP1 presents "0" (i.e., the input signal IN1 is not greater than the duty signal D1, which corresponds to Case (a) mentioned above), the output of the first multiplexer 113 may be the second signal S2 and the output of the fourth multiplexer 123 may be the third signal S3. Therefore, the first output signal O1 and the second output signal O2 may be the second signal S2 and the third signal S3 respectively. Since both of the first output signal O1 and the second output signal O2 are signals representing a specific number instead of ground signal GND, the corresponding set of target PWM signals generated in accordance with the first output signal O1 and the second output signal O2 may form a quaternary modulation. On the other hand, when the CP1 present "1" (i.e., the input signal IN1 is greater than the duty signal D1, which corresponds to Case (b) mentioned above), the output of the first multiplexer 113 may be the first signal S1 and the output of the fourth multiplexer 123 may be the ground signal GND. Therefore, the first output signal O1 and the second output signal O2 will be respectively the first signal S1 and the ground signal GND, and the corresponding set of target PWM signals generated in accordance with the first output signal O1 and the second output signal O2 may form a ternary modulation.

Still referring to Table 1, in Cases (c) and (d), the polarity of the input signal IN1 is negative, and the polarity signal P1 presents "1". Accordingly, the third multiplexer 115 may select the output of the second multiplexer 114 as the first output signal O1, and the sixth multiplexer 125 may select the output of the fifth multiplexer 124 as the second output signal O2, whereas the outputs of the second multiplexer 114 and the fifth multiplexer 124 may be determined according to the comparison signal CP2 instead of the comparison signal CP1. When the comparison signal CP2 presents "0" (i.e., an inverse of the input signal IN1 is not greater than the duty signal D1, which corresponds to Case (c) mentioned above), the output of the second multiplexer 114 may be the second signal S2 and the output of the fifth multiplexer 124 may be the third signal S3. Therefore, the first output signal O1 and the second output signal O2 will be the second signal S2 and the third signal S3 respectively. Similar to Case (a), since both of the first output signal O1 and the second output signal O2 are signals representing a specific number instead of ground signal GND, the corresponding set of target PWM signals generated in accordance with the first output signal O1 and the second output signal O2 may form a quaternary modulation. On the other hand, when the CP1 presents "1" (i.e., the inverse of the input signal IN1 is greater than the duty signal D1, which corresponds to Case (d) mentioned above), the output of the second multiplexer 114 may be the ground signal GND and the output of the fifth multiplexer 124 may be the fourth signal S4. Therefore, the first output signal O1 and the second output signal O2 will be the ground signal GND and the fourth signal S4 respectively, and the corresponding set of target PWM signals generated in accordance with the first output signal O1 and the second output signal O2 may form a ternary modulation.

Note that the slash in Table 1 is for representing the signal that does not need to be considered in the corresponding cases. That is, no matter the signal presents "0" or "1", the first output signal O1 and the second output signal O2 will present the same consequences.

Figure 3A:
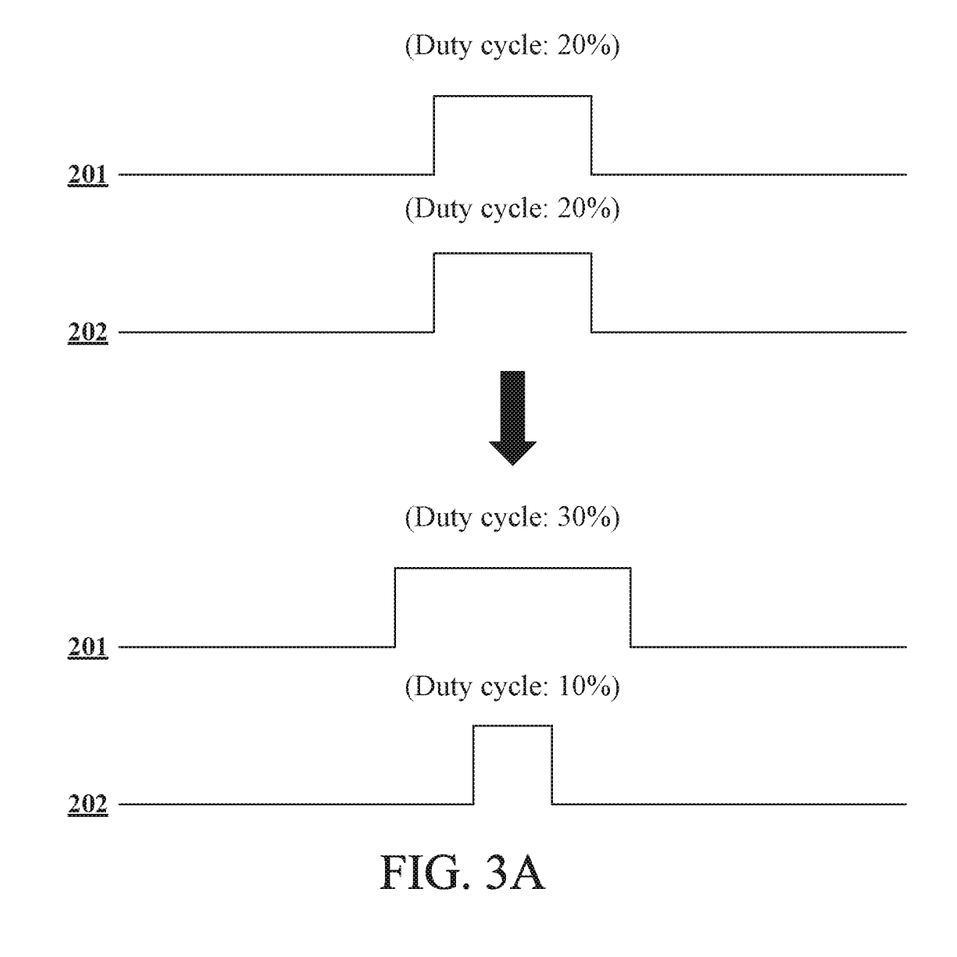
FIG. 3A depicts a schematic view of a quaternary modulation according to one or more embodiments of the present disclosure.
Figure 3B:
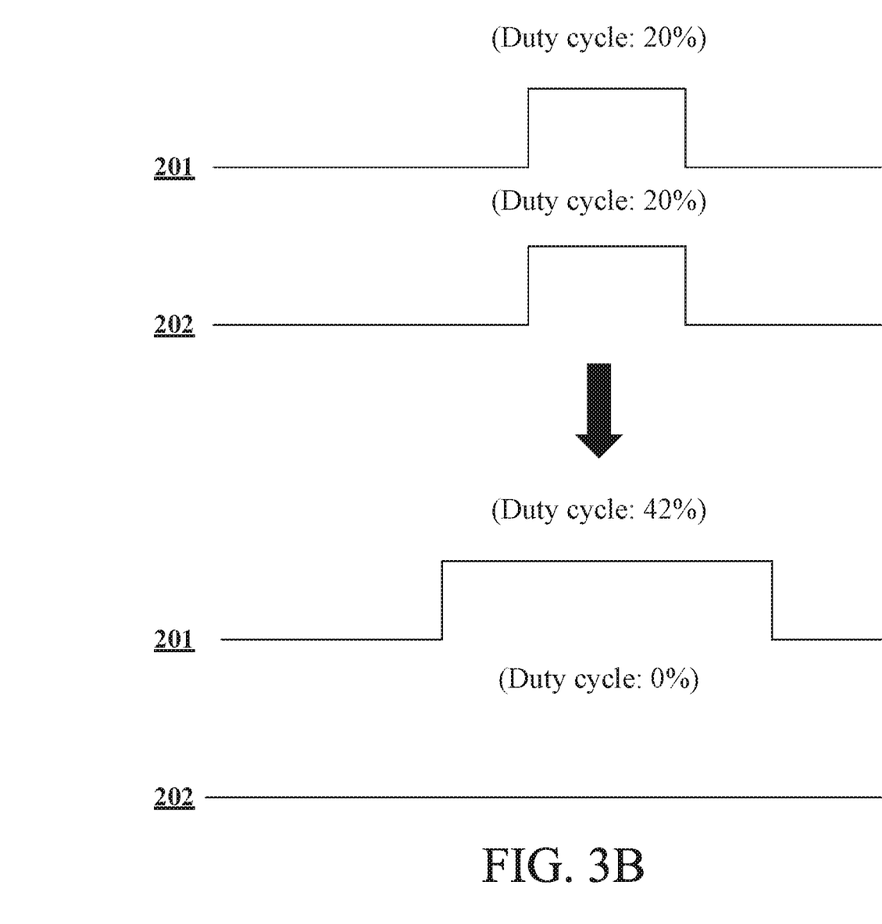
FIG. 3B depicts a schematic view of a ternary modulation according to one or more embodiments of the present disclosure.

FIG. 3A depicts a schematic view of a quaternary modulation according to one or more embodiments of the present disclosure. FIG. 3B depicts a schematic view of a ternary modulation according to one or more embodiments of the present disclosure. The contents shown in FIG. 3A and FIG. 3B are only for illustrating the embodiment of the present disclosure, instead of limiting the present disclosure.

Referring to FIG. 2 and FIG. 3A together, a set of target PWM signals 201 and 202, each initially with a duty cycle of 20%, may be applied to the target device by a source of PWM signal (e.g., the abovementioned PWM-signal-generating circuit) at the beginning of the modulation. Assuming that the target duty cycle corresponding to the modulation formed by the target PWM signals 201 and 202 is 20%, then since the input signal may be set as representing half of the target duty cycle, the input signal IN1 may be set to represent a decimal number of "0.1" in a binary form. The duty signal D1 may be set as representing the starting duty cycle of the modulation as mentioned before, and thus may represent, for example, a decimal number of "0.2" in a binary form. Such a combination of the input signal IN1 and the duty signal D1 may correspond to Case (a) as mentioned when describing Table 1.

Next, the switching circuit 1 may add the duty signal D1 and the input signal IN1 to obtain the first output signal O1 (which is equivalent to the second signal S2) representing a decimal number of "0.3", and subtract the input signal IN1 from the duty signal D1 to obtain the second output signal O2 (which is equivalent to the third signal S3) representing a decimal number of "0.1". Subsequently, the target PWM signal 201 with a duty cycle of 30% and the target PWM signal 202 with a duty cycle of 10% may be generated accordingly. The set of target PWM signals 201 and 202 may cause a 20% difference of duty cycle from the target PWM signal 201 to the target PWM signal 202 when driving the target device, thereby forming a quaternary modulation corresponding to a target duty of 20%.

Referring to FIG. 2 and FIG. 3B for another example, the set of target PWM signals 201 and 202, each initially with a duty cycle of 20%, may similarly be applied to the target device by a source of PWM signal at the beginning of the modulation. Therefore, the duty signal D1 is set to represent a decimal number of "0.2" in a binary form. It is assumed that and the input signal IN1 is set to represent a decimal number of "0.21" (i.e., the target duty cycle is 42%) in a binary form. Such a combination of the input signal IN1 and the duty signal D1 may correspond to Case (b) as mentioned when describing Table 1.

Next, the switching circuit 1 may perform a left-shift operation to the input signal IN1 to obtain the first output signal O1 (which is equivalent to the first signal S1) representing a decimal number of "0.42", and adopt the ground signal GND as the second output signal O2 representing a decimal number of "0". Subsequently, the target PWM signal 201 with a duty cycle of 42% and the target PWM signal 202 with a duty cycle of 0% may be generated accordingly. The set of target PWM signals 201 and 202 may cause a 42% difference of duty cycle from the target PWM signal 201 to the target PWM signal 202 when driving the target device, thereby forming a ternary modulation corresponding to a target duty of 42%.

Based on the above description, the switching circuit 1 is able to provide a set of signals indicating the corresponding duty cycles of the target PWM signals according to the input signal IN1 and the duty signal D1. The source of PWM signals (e.g., the PWM-signal-generating circuit) may generate the set of target PWM signals to form a ternary modulation or a quaternary modulation corresponding to a specific target duty, so as to drive a target device. The switching circuit 1 of the present disclosure not only allows the starting duty cycle to be less than 50%, but also provides a more flexible switching mechanism to ternary modulation since the required target duty cycle for switching to ternary modulation can be less than 100%.

Figure 4:
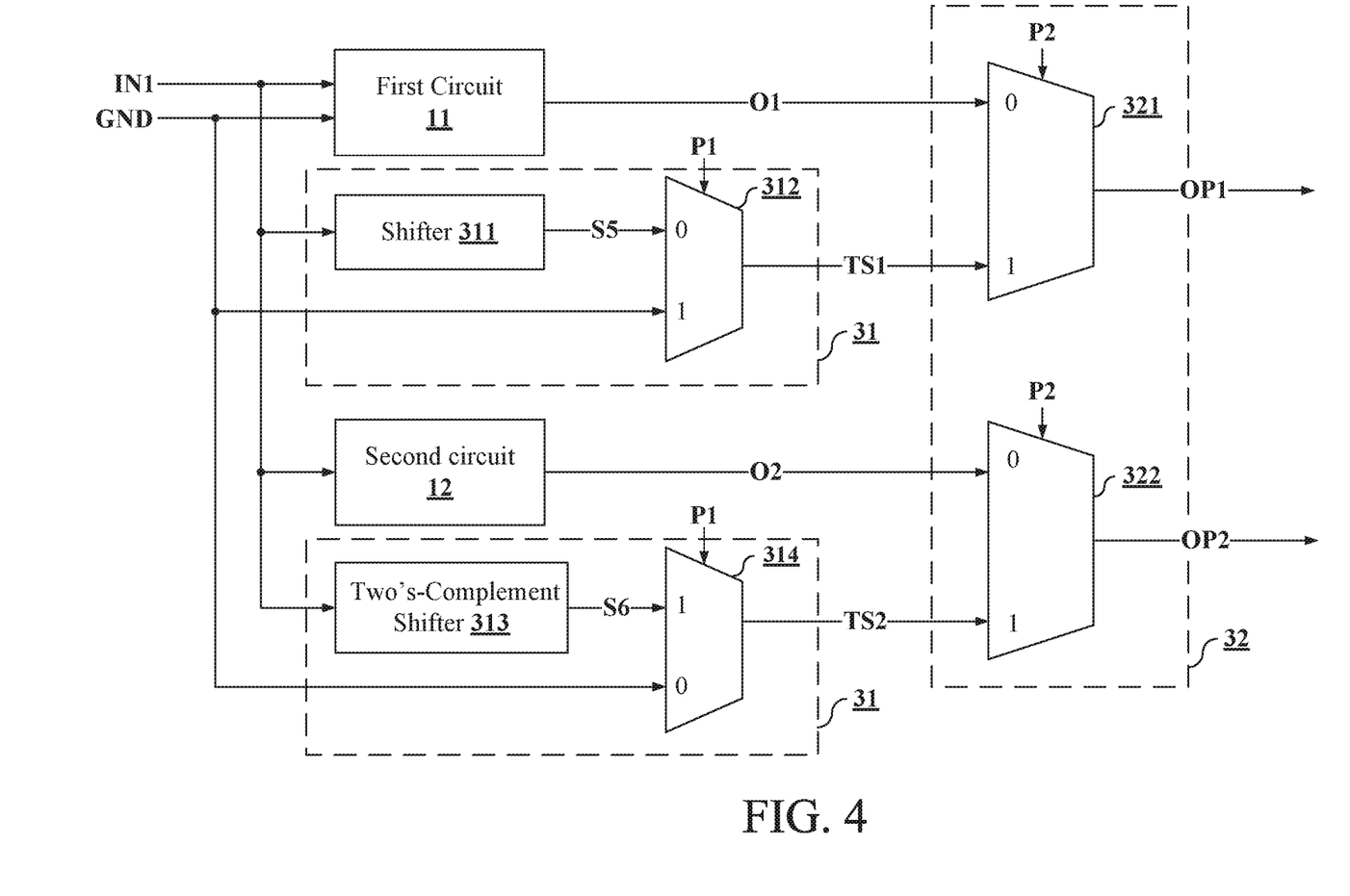
FIG. 4 depicts a schematic view of a switching circuit comprising a power-saving-mode control circuit according to one or more embodiments of the present disclosure.

FIG. 4 depicts a schematic view of a switching circuit comprising a power-saving-mode control circuit according to one or more embodiments of the present disclosure. The contents shown in FIG. 4 are only for illustrating the embodiment of the present disclosure, instead of limiting the present disclosure.

Referring to FIG. 4, in some embodiments, the switching circuit 1 may further comprise a power-saving-mode control circuit electrically connected with the target device and the third multiplexer 115 and the sixth multiplexer 125 (not shown). The power-saving-mode control circuit may be configured to generate a first power-saving output signal OP1 and a second power-saving output signal OP2, and may comprise a ternary-modulation setting circuit 31 and a ternary-modulation switching circuit 32. The ternary-modulation setting circuit 31 may be configured to generate a set of ternary-modulation setting signals including a ternary-modulation setting signal TS1 and a ternary-modulation setting signal TS2, and the ternary-modulation switching circuit 32 may be configured to allow passing of the set of ternary-modulation-setting signals or both of the first output signal O1 and the second output signal O2 according to a power-saving-mode control signal P2.

The ternary-modulation setting circuit 31 may basically comprise a shifter 311, a two's-complement shifter 313, and multiplexers 312 and 314, wherein the multiplexer 312 may be electrically connected with the shifter 311 and the ground-signal source, and the multiplexer 314 is electrically connected with the two's-complement shifter 313 and the ground-signal source. The shifter 311 may perform a left-shift operation of one bit for the input signal IN1 so as to generate a fifth signal S5, and the multiplexer 312 may select one of the fifth signal S5 and the ground signal GND according to the polarity signal P1 so as to generate the ternary-modulation signal TS1. The two's-complement shifter 313 may perform a two's-complement transformation and the left-shift operation of one bit for the input signal IN1 so as to generate a sixth signal S6, and, similarly, the multiplexer 314 may select one of the sixth signal S6 and the ground signal GND according to the polarity signal P1 so as to generate the ternary-modulation signal TS2.

The ternary-modulation switching circuit 32 may basically comprise multiplexer 321 and 322, wherein the multiplexer 321 is electrically connected with the multiplexer 312 and the third multiplexer 115 (not shown) of the first computing circuit 11, and the multiplexer 322 is electrically connected with the multiplexer 314 and the sixth multiplexer 125 (not shown) of the second computing circuit 12. According to a power-saving-mode control signal P2, the multiplexer 321 may allow passing of the ternary-modulation setting signal TS1 or the first output signal O1 so as to generate the first power-saving output signal OP1, and the multiplexer 322 may allow passing of the ternary-modulation setting signal TS2 or the first output signal O2 so as to generate the second power-saving output signal OP2. When the power-saving-mode control signal P2 represents "0", the first output signal O1 and the second output signal O2 may be allowed passing. On the other hand, when the power-saving-mode control signal P2 represents "1", the ternary-modulation setting signal TS1 and the ternary-modulation setting signal TS2 may be allowed passing.

In some embodiments, the power-saving-mode control signal P2 may represent "1" when the input signal IN1 is greater than a first threshold value, and the power-saving-mode control signal P2 may represents "0" when the input signal IN1 is less than a second threshold value. In some embodiments, the first threshold value is less than the duty signal D1, and the second threshold value is less than the first threshold value.

In other words, since the ternary modulation is able to provide lower power consumption than the quaternary modulation when providing PWM signals corresponding to "large" target duty cycles, the power-saving-mode control circuit may replace the first output signal O1 and the second output signal O2 with the set of ternary modulation signals TS1 and TS2 when determining that the input signal IN1 (indicating the target duty cycle) is higher than a first threshold value.

In some embodiments, power-saving-mode control signal P2 represents "1" when the input signal IN1 is greater than a first threshold value, and the power-saving-mode control signal P2 represents "0" when the input signal IN1 is less than a second threshold value and the polarity of the input signal IN1 (which may be indicated by the polarity signal P1 mentioned above) has consecutively changed between positive and negative for a third threshold value of times within a time period.

In some embodiments, the power-saving-mode control signal may be generated by a signal generating circuit which at least comprises one or more comparators (e.g., digital comparators) for comparing the input signal IN1, the first threshold value, and the second threshold value. In some embodiments, the signal generating circuit may further comprise a counter, so as to determine whether the polarity of the input signal IN1 has consecutively changed between positive and negative for a third threshold value of times or not.

It shall be appreciated that the terms such as "first", "second", "third", "fourth", "fifth", and "sixth recited in the specification and the claims of the present invention are used only for distinguishing different elements, instead of limiting the order of said elements.

Figure 5:
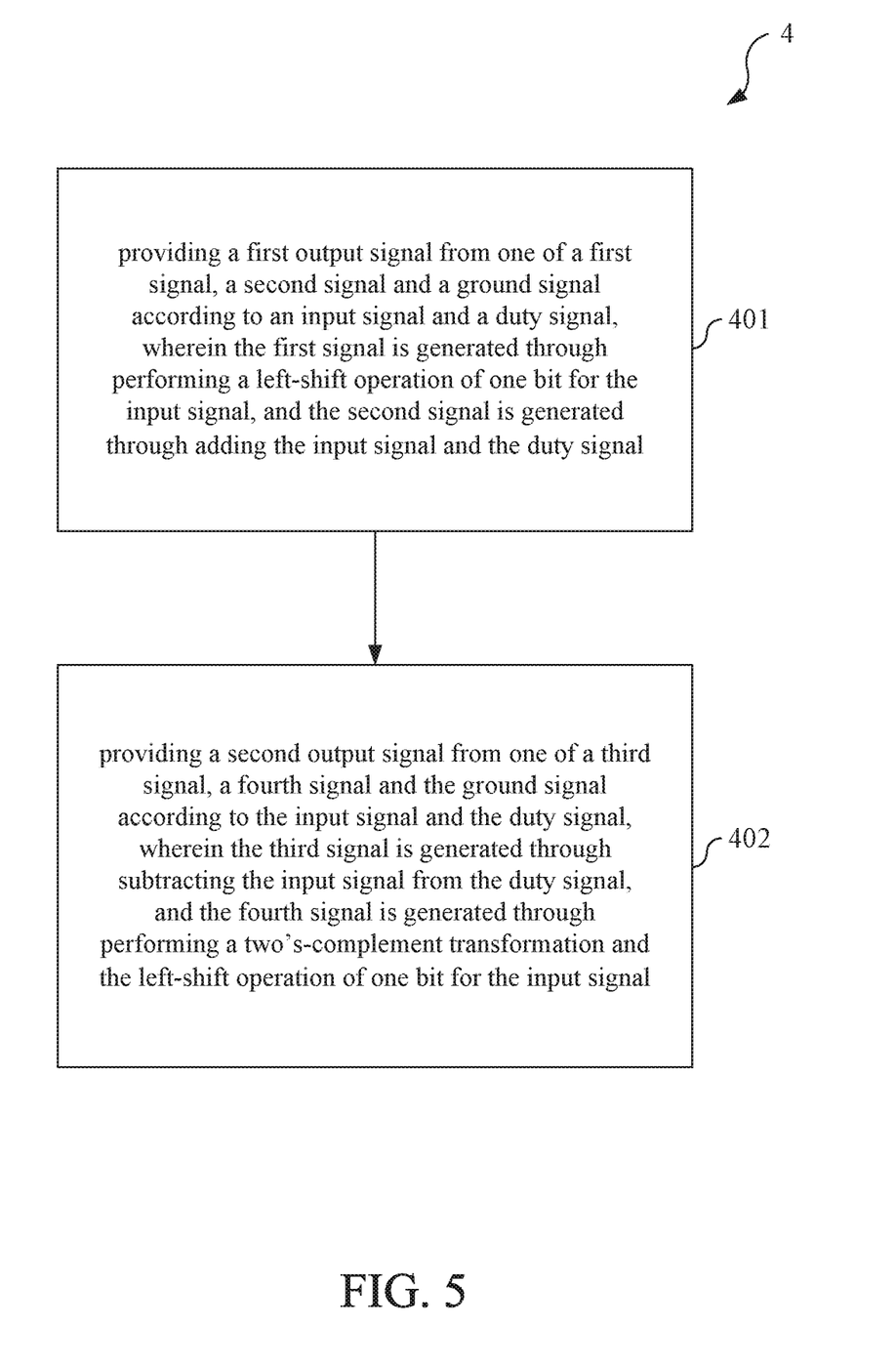
FIG. 5 depicts a method for switching between a ternary modulation and a quaternary modulation according to one or more embodiments of the present disclosure.

FIG. 5 depicts a method for switching between a ternary modulation and a quaternary modulation according to one or more embodiments of the present disclosure. The contents shown in FIG. 5 are only for illustrating the embodiment of the present disclosure, instead of limiting the present disclosure.

Referring to FIG. 5, a method 4 for switching between a ternary modulation and a quaternary modulation for a target device may be executed by an electronic computing device. The method 4 may comprise steps as follows: providing a first output signal from one of a first signal, a second signal and a ground signal according to an input signal and a duty signal, wherein the first signal is generated through performing a left-shift operation of one bit for the input signal, and the second signal is generated through adding the input signal and the duty signal (labeled as step 401); and providing a second output signal from one of a third signal, a fourth signal and the ground signal according to the input signal and the duty signal, wherein the third signal is generated through subtracting the input signal from the duty signal, and the fourth signal is generated through performing a two's-complement transformation and the left-shift operation of one bit for the input signal (labeled as step 402) The first output signal may be the first signal and the second output signal may be a ground signal when a polarity of the input signal is positive and a number represented by the input signal is greater than a number represented by the duty signal. The first output signal may be the second signal and the second output signal may be the third signal when the polarity of the input signal is positive and the number represented by the input signal is not higher than the number represented by the duty signal, or when the polarity of the input signal is negative and a number represented by an inverse signal of the input signal is not greater than the number represented by the duty signal. The first output signal may be the ground signal and the second output signal may be the fourth signal when the polarity of the input signal is negative and the number represented by the inverse signal is greater than the number represented by the duty signal.

In some embodiments, regarding the method 4, the first output signal and the second output signal may be provided to a PWM-signal-generating circuit such that the PWM-signal-generating circuit generates a set of PWM signals according to the first output signal and the second output signal. The set of PWM signals may form the ternary modulation or the quaternary modulation.

In some embodiments, regarding the method 4, a duty cycle of the ternary or the quaternary modulation caused by the first output signal and the second output signal may be twice as much as the number represented by the input signal.

In some embodiments, the method 4 may further comprise steps as follows:

generating, a set of ternary-modulation setting signals according to the input signal and the polarity of the input signal; and determining passing the set of ternary-modulation setting signals or both of the first output signal and the second output signal according to a power-saving-mode control signal, wherein the first output signal and the second output signal are allowed passing when the power-saving-mode control signal represents zero, and the set of ternary-modulation-setting signals are allowed passing when the power-saving-mode control signal represents one. In some embodiments, the power-saving-mode control signal may represent one when the number represented by the input signal is greater than a first threshold value. Moreover, the power-saving-mode control signal represents zero when the number represented by the input signal is less than a second threshold value. In some other embodiments, the power-saving-mode control signal may represent one when the number represented by the input signal is greater than a first threshold value, and the power-saving-mode control signal represents zero when the number represented by the input signal is less than a second threshold value and the polarity of the input signal has consecutively changed between positive and negative for a third threshold value of times within a time period. In some other embodiments, the first threshold value may be less than the number represented by the duty signal, and the second threshold value may be less than the first threshold value.

Each embodiment of the method 4 basically corresponds to a certain embodiment of the switching circuit 1. Therefore, those of ordinary skill in the art may fully understand and implement all the corresponding embodiments of the modulation method 4 simply by referring to the above descriptions of the switching circuit 1, even though not all of the embodiments of the modulation method 4 are described in detail above.

The above disclosure is related to the detailed technical contents and inventive features thereof. People of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A switching circuit for switching between a ternary modulation and a quaternary modulation for a target device, comprising:

a first computing circuit, being configured to provide a first output signal and comprising a shifter, an adder, a first multiplexer, a second multiplexer, and a third multiplexer, the first multiplexer being electrically connected with the shifter and the adder, the second multiplexer being electrically connected with the adder and a ground-signal source, the third multiplexer being electrically connected with the first multiplexer and the second multiplexer, wherein the shifter being configured to perform a left-shift operation of one bit for an input signal so as to generate a first signal, and the adder being configured to add the input signal and a duty signal so as to generate a second signal; and a second computing circuit, being configured to provide a second output signal and comprising a subtractor, a two's-complement shifter, a fourth multiplexer, a fifth multiplexer and a sixth multiplexer, the fourth multiplexer being electrically connected with the ground-signal source and the subtractor, the fifth multiplexer being electrically connected with subtractor and the two's-complement shifter, and the sixth multiplexer being electrically connected with the fourth multiplexer and the fifth multiplexer, wherein the subtractor is configured to subtract the input signal from the duty signal so as to generate a third signal, and the two's-complement shifter is configured to perform a two's-complement transformation and the left-shift operation of one bit for the input signal so as to generate a fourth signal;

wherein:

the first output signal output by the third multiplexer is the first signal and the second output signal output by the sixth multiplexer is a ground signal when a polarity of the input signal is positive and a number represented by the input signal is greater than a number represented by the duty signal;

the first output signal is the second signal and the second output signal is the third signal when the polarity of the input signal is positive and the number represented by the input signal is not greater than the number represented by the duty signal, or when the polarity of the input signal is negative and a number represented by an inverse signal of the input signal is not greater than the number represented by the duty signal; and the first output signal is the ground signal and the second output signal is the fourth signal when the polarity of the input signal is negative and the number represented by the inverse signal is higher than the number represented by the duty signal.

2. The switching circuit of claim 1, wherein the first computing circuit and the second computing circuit being electrically connected with a PWM-signal generating circuit, the PWM-signal generating circuit being configured to generate a set of PWM signals according to the first output signal and the second output signal, the set of PWM signals forming the ternary modulation or the quaternary modulation.

3. The switching circuit of claim 1, wherein a duty cycle of the ternary modulation or the quaternary modulation caused by the first output signal and the second output signal is twice as much as the number represented by the input signal.

4. The switching circuit of claim 1, further comprising a power-saving-mode control circuit electrically connected with the third multiplexer and the sixth multiplexer, wherein the power-saving-mode control circuit comprises:
a ternary-modulation setting circuit, being configured to generate a set of ternary-modulation setting signals according to the input signal and the polarity of the input signal; and
a ternary-modulation switching circuit, being electrically connected with the ternary-modulation setting circuit, the third multiplexer and the sixth multiplexer, and being configured to allow passing of the set of ternary-modulation setting signals or both of the first output signal and the second output signal according to a power-saving-mode control signal, wherein the ternary-modulation switching circuit allows passing of the first output signal and the second output signal when the power-saving-mode control signal represents zero, and allows passing of the set of ternary-modulation setting signals when the power-saving-mode control signal represents one.

5. The switching circuit of claim 4, wherein the power-saving-mode control signal represents one when a number represented by the input signal is greater than a first threshold value, and the power-saving-mode control signal represents zero when the number represented by the input signal is less than a second threshold value.

6. The switching circuit of claim 4, wherein the power-saving-mode control signal represents one when the number represented by the input signal is greater than a first threshold value, and the power-saving-mode control signal represents zero when the number represented by the input signal is less than a second threshold value and the polarity of the input signal has consecutively changed between positive and negative for a third threshold value of times within a time period.

7. The switching circuit of claim 5, wherein the first threshold value is less than the number represented by the duty signal, and the second threshold value is less than the first threshold value.

8. A method for switching between a ternary modulation or a quaternary modulation for a target device, the method being executed by an electronic computing device and comprising following steps:
providing a first output signal from one of a first signal, a second signal and a ground signal according to an input signal and a duty signal, wherein the first signal is generated through performing a left-shift operation of one bit for the input signal, and the second signal is generated through adding the input signal and the duty signal; and
providing a second output signal from one of a third signal, a fourth signal and the ground signal according to the input signal and the duty signal, wherein the third signal is generated through subtracting the input signal from the duty signal, and the fourth signal is generated through performing a two's-complement transformation and the left-shift operation of one bit for the input signal;

wherein:
the first output signal is the first signal and the second output signal is a ground signal when a polarity of the input signal is positive and a number represented by the input signal is greater than a number represented by the duty signal;
the first output signal is the second signal and the second output signal is the third signal when the polarity of the input signal is positive and the number represented by the input signal is not greater than the number represented by the duty signal, or when the polarity of the input signal is negative and a number represented by an inverse signal of the input signal is not greater than the number represented by the duty signal; and
the first output signal is the ground signal and the second output signal is the fourth signal when the polarity of the input signal is negative and the number represented by the inverse signal is higher than the number represented by the duty signal.

9. The method of claim 8, wherein the first output signal and the second output signal are provided to a PWM-signal-generating circuit such that the PWM-signal-generating circuit generates a set of PWM signals according to the first output signal and the second output signal, the set of PWM signals forming the ternary modulation or the quaternary modulation.

10. The method of claim 8, wherein a duty cycle of the ternary modulation or the quaternary modulation caused by the first output signal and the second output signal is twice as much as the number represented by the input signal.

11. The method of claim 8, further comprising the following steps:
generating, a set of ternary-modulation setting signals according to the input signal and the polarity of the input signal; and
determining passing the set of ternary-modulation setting signals or both of the first output signal and the second output signal according to a power-saving-mode control signal, wherein the first output signal and the second output signal are allowed passing when the power-saving-mode control signal represents zero, and the set of ternary-modulation setting signals are allowed passing when the power-saving-mode control signal represents one.

12. The method of claim 11, wherein the power-saving-mode control signal represents one when the number represented by the input signal is greater than a first threshold value, and the power-saving-mode control signal represents zero when the number represented by the input signal is less than a second threshold value.

13. The method of claim 11, wherein the power-saving-mode control signal represents one when the number represented by the input signal is greater than a first threshold value, and the power-saving-mode control signal represents zero when the number represented by the input signal is less than a second threshold value and the polarity of the input signal has consecutively changed between positive and negative for a third threshold value of times within a time period.

14. The method of claim 12, wherein the first threshold value is less than the number represented by the duty signal, and the second threshold value is less than the first threshold value.

* * * * *